(12) United States Patent
Goodman

(10) Patent No.: US 6,512,178 B2
(45) Date of Patent: Jan. 28, 2003

(54) SLIDING COVER SYSTEM

(75) Inventor: James P. Goodman, Ft. Collins, CO (US)

(73) Assignee: Hach Company, Loveland, CO (US)

( * ) Notice: Subject to any disclaimer, the term of this patent is extended or adjusted under 35 U.S.C. 154(b) by 0 days.

(21) Appl. No.: 09/957,863

(22) Filed: Sep. 21, 2001

(65) Prior Publication Data

US 2002/0060086 A1 May 23, 2002

Related U.S. Application Data

(60) Provisional application No. 60/236,680, filed on Sep. 29, 2000.

(51) Int. Cl.$^7$ ................................................. H02G 3/14
(52) U.S. Cl. ............................ 174/66; 174/67; 220/241; 220/242
(58) Field of Search .............................. 174/66, 67, 55; 220/241, 242; D13/177

(56) References Cited

U.S. PATENT DOCUMENTS

| | | | | | |
|---|---|---|---|---|---|
| 4,425,725 A | * | 1/1984 | Moustakas et al. | ........ | 174/66 X |
| 5,067,907 A | * | 11/1991 | Sholey | ........ | 174/67 X |
| 6,037,542 A | * | 3/2000 | McCall | ........ | 174/66 |
| 6,070,307 A | * | 6/2000 | Kawanabe | ........ | 174/66 X |

* cited by examiner

Primary Examiner—Dean A. Reichard
Assistant Examiner—Dhiru R Patel
(74) Attorney, Agent, or Firm—Dean P. Edmundson

(57) ABSTRACT

An instrument housing is described having an arcuate upper surface and a sliding cover which rests on the upper surface of the instrument. The cover slides between open and closed positions. The cover includes a base with an elongated slot, and the upper surface of the instrument includes a post for engaging the slot. The theoretical pivot point for the cover is located outside of the housing for the instrument.

5 Claims, 6 Drawing Sheets

SLIDING COVER SYSTEM

CROSS-REFERENCE TO RELATED APPLICATION

This application is based upon, and claims the benefit of, my Provisional Application No. 60/236,680, filed Sep. 29, 2000.

FIELD OF THE INVENTION

This invention relates to cover systems. More particularly, this invention relates to cover systems for scientific instruments, e.g. spectrometers.

BACKGROUND OF THE INVENTION

Many scientific instruments (e.g. spectrometers) include a compartment or location where a sample to be analyzed must be placed for testing. When the testing involves the use of light, it is necessary to close the compartment to prevent stray light from interfering with the testing.

A variety of hinged and sliding covers have been previously used in a variety of instruments. None of such covers, however, have exhibited the features and advantages provided by the present invention.

SUMMARY OF THE INVENTION

In accordance with the present invention there is provided an instrument housing which includes a sample compartment and a sliding cover system for enclosing the compartment. The sliding cover system is especially useful in instruments involving optical measurements of samples (e.g. spectrometers).

In one embodiment, the system comprises:

(a) cover means including an elongated slot or raceway;

(b) a post member secured to the instrument housing;

wherein the raceway of the cover means is adapted to engage the post member.

The upper surface of the instrument housing also preferably includes a recess for receiving the cover means and guiding the cover between open and closed positions. Alternatively, the cover could be guided by mating slots and ribs in the upper surface of the housing and the lower surface of the cover (e.g. there could be one or more slots in the lower surface of the cover and one or more protruding ribs or raised features in the upper surface of the housing, or vice-versa).

Preferably the cover is arcuate shaped, and the upper surface of the instrument housing is also arcuate shaped so that the cover slides in a radial fashion on the mating surface of the housing. Gravity also assists in the movement of the cover between open and closed positions as the mass of the cover passes over the center of gravity. Gravity also provides the force to hold the cover in its fully open or fully closed positions.

No fasteners are visible in the attachment of the cover to the housing. The cover can be removed by the user without the use of tools. This results in ease of cleaning of the housing and the recess where the cover resides.

In the open position, the cover remains attached to its mating housing and is not obtrusive. The cylindrical or spherical shape of the cover also provides closure over a peak point, allowing a high clearance while at the same time providing a lower access height when the cover is in the open position.

The cover is the uppermost part of the instrument, which makes it easy for a user to move the cover to its open position even while holding samples or other items.

The radial or spherical shape interface between the sliding cover and the mating support surface of the instrument housing provides for a theoretical pivot point outside of the instrument's physical envelope.

Other features and advantages of the cover system of this invention will be apparent from the following detailed description and the accompanying drawings.

BRIEF DESCRIPTION OF THE DRAWINGS

The invention is described in more detail hereafter with reference to the accompanying drawings, wherein like reference characters refer to the same parts throughout the several views and in which.

DETAILED DESCRIPTION OF THE INVENTION

Figure 1:
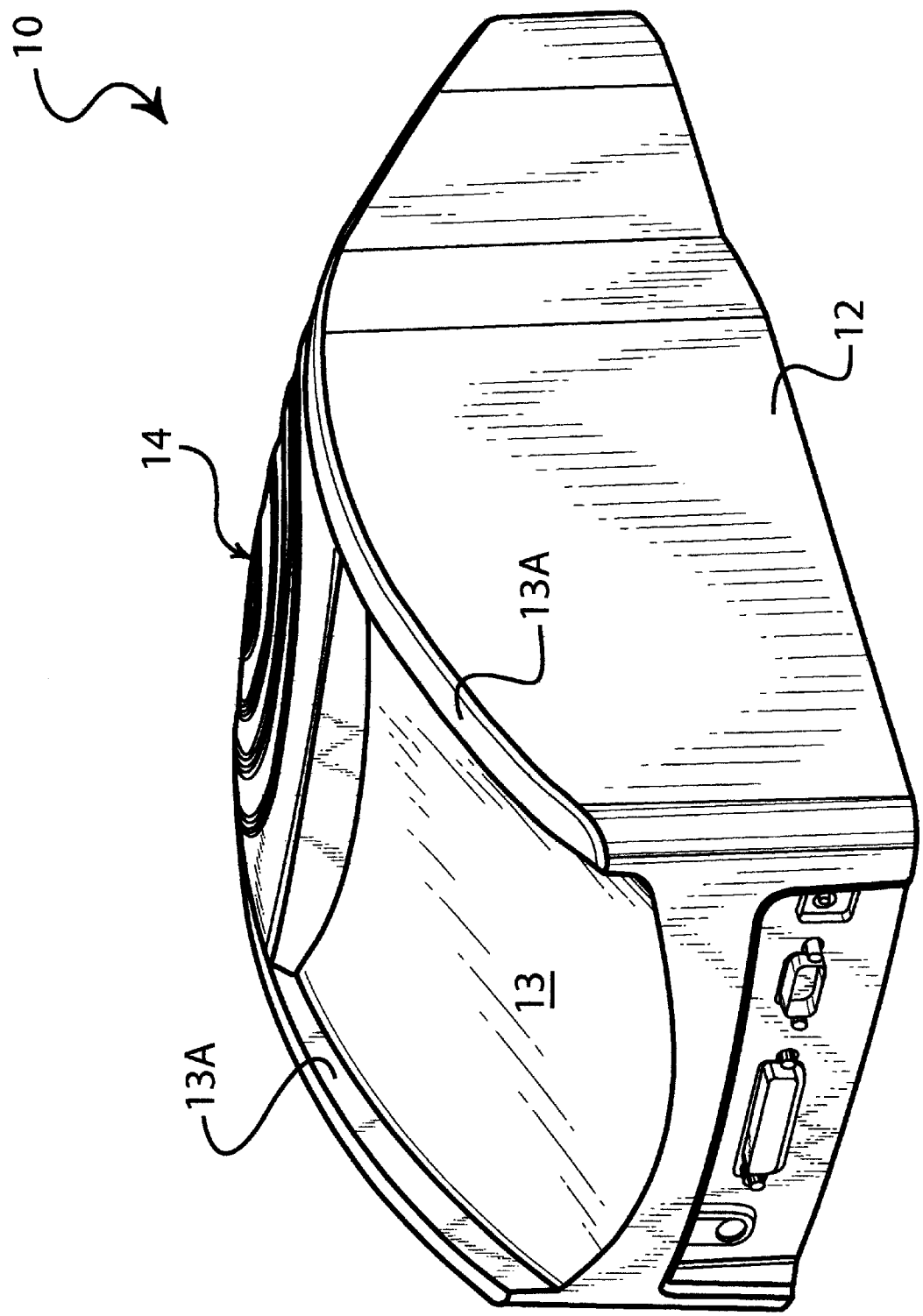
FIG. 1 is a rear perspective view of a scientific instrument which includes the sliding cover system of the invention.
Figure 2:
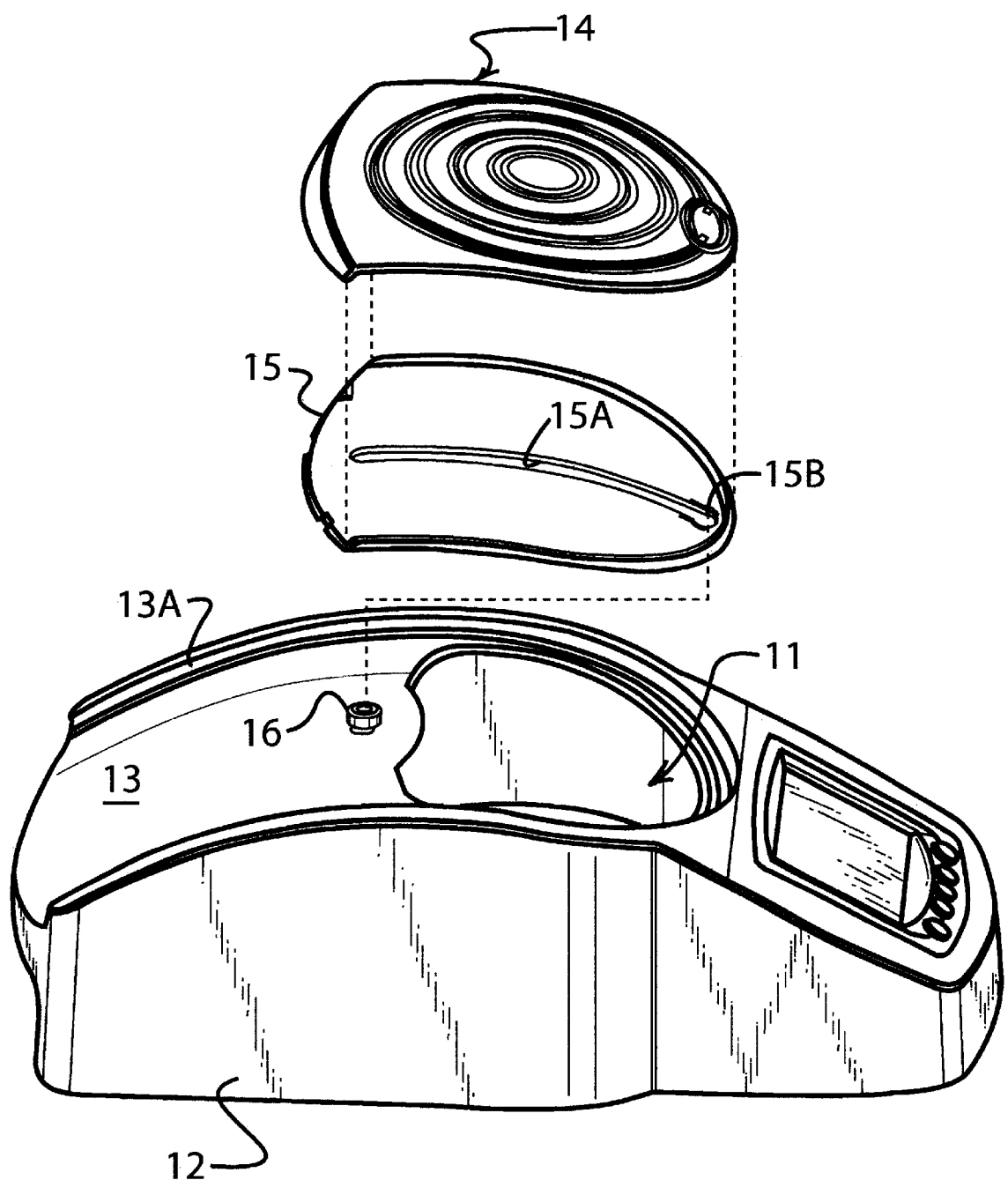
FIG. 2 is an exploded view of the instrument and cover system shown in FIG. 1.
Figure 3:
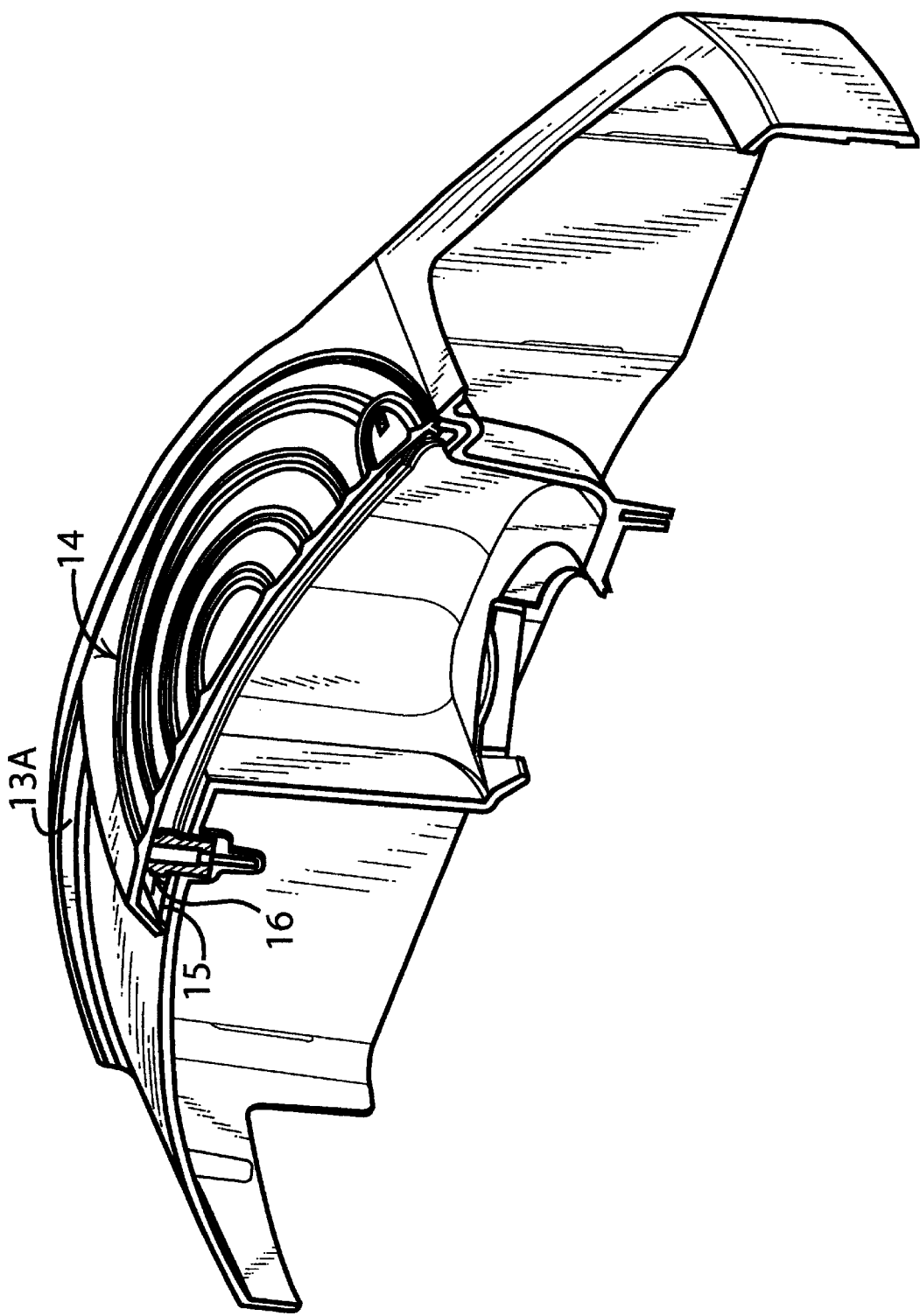
FIG. 3 is a cross-sectional view of the instrument housing and the cover system of FIG. 1 with the cover in its closed position.
Figure 4:
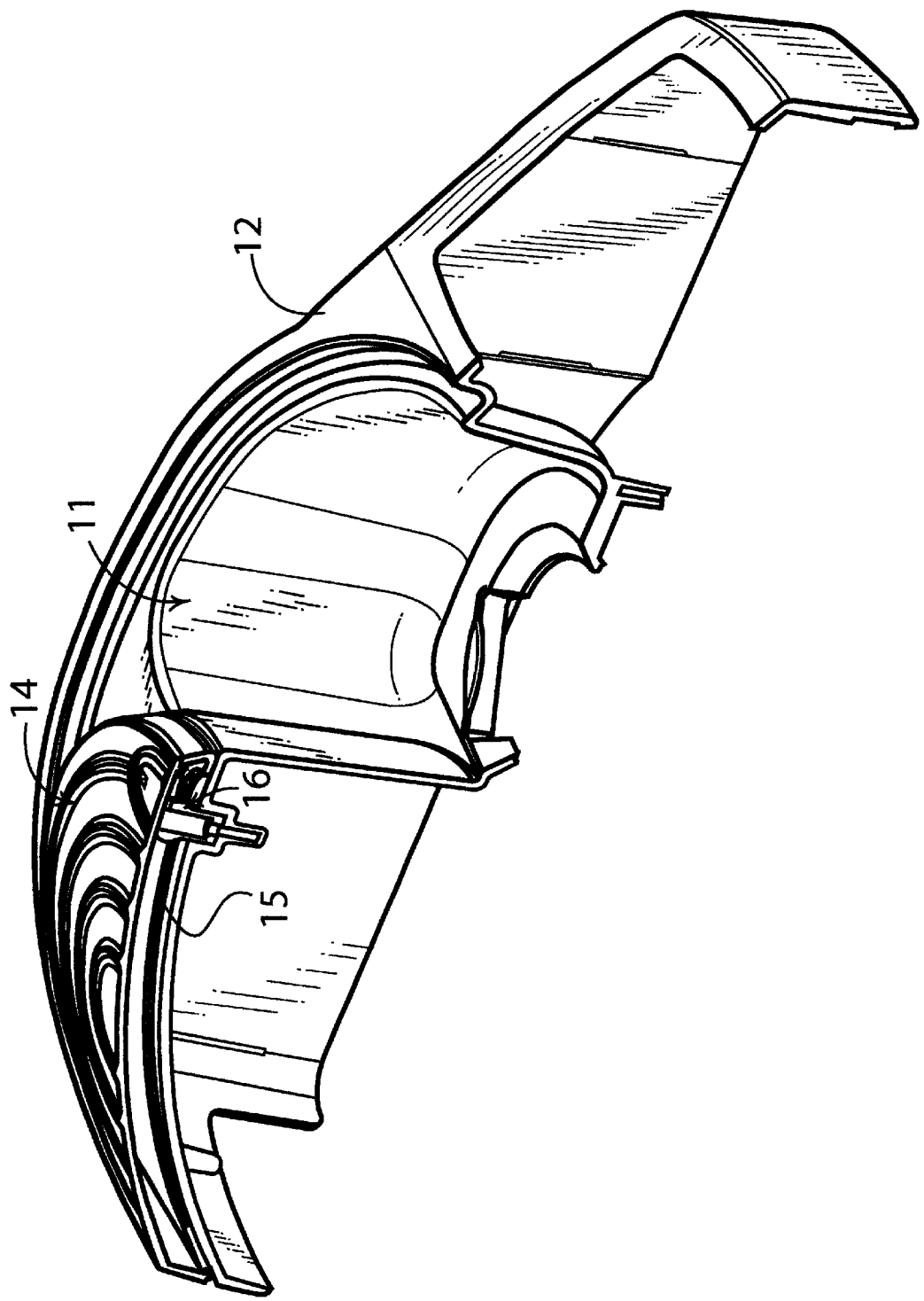
FIG. 4 is a cross-sectional view of the instrument housing and the cover system of FIG. 1 with the cover in its open position.
Figure 5:
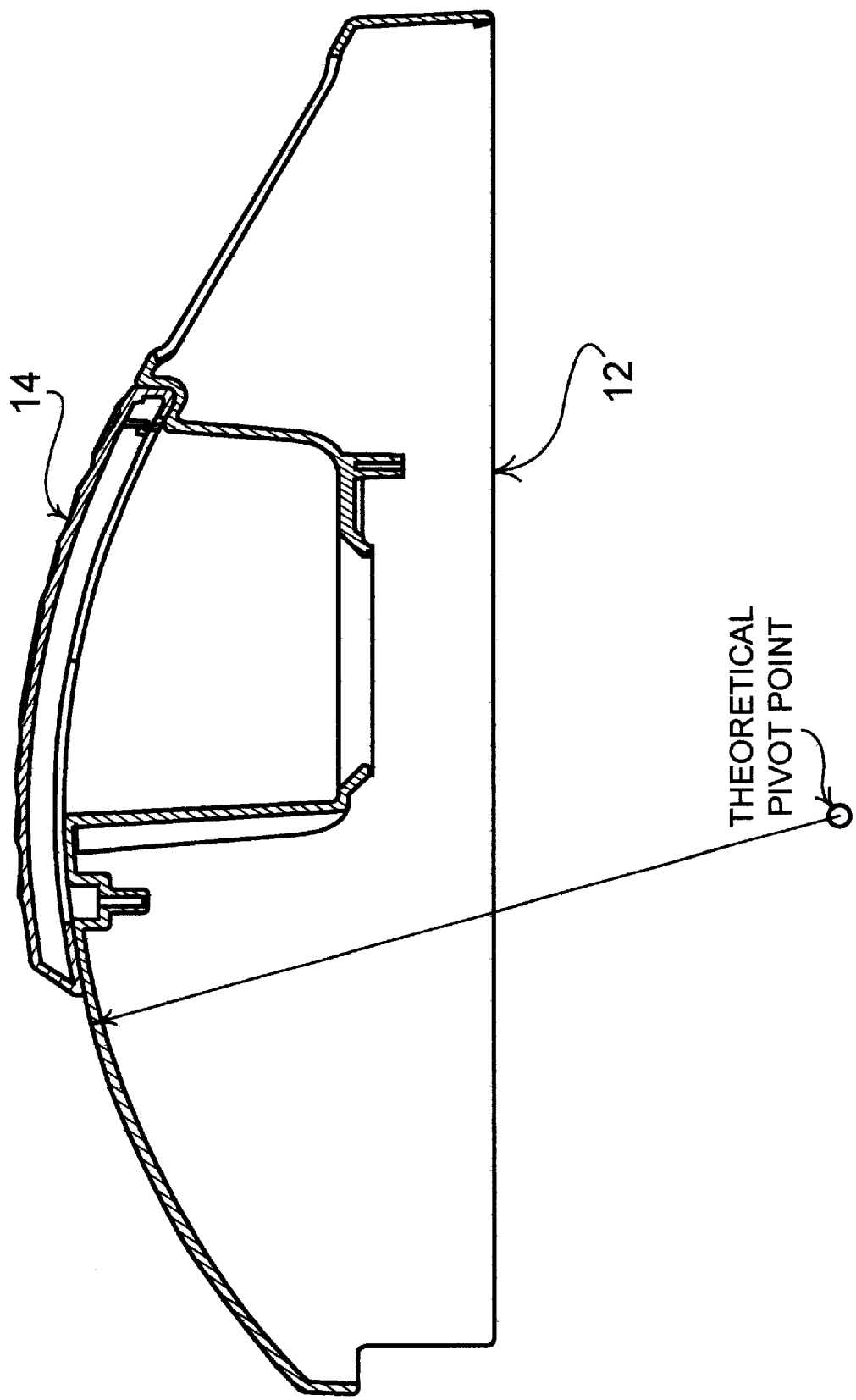
FIG. 5 is a cross-sectional view of the instrument showing the theoretical pivot point for the cover.
Figure 6:
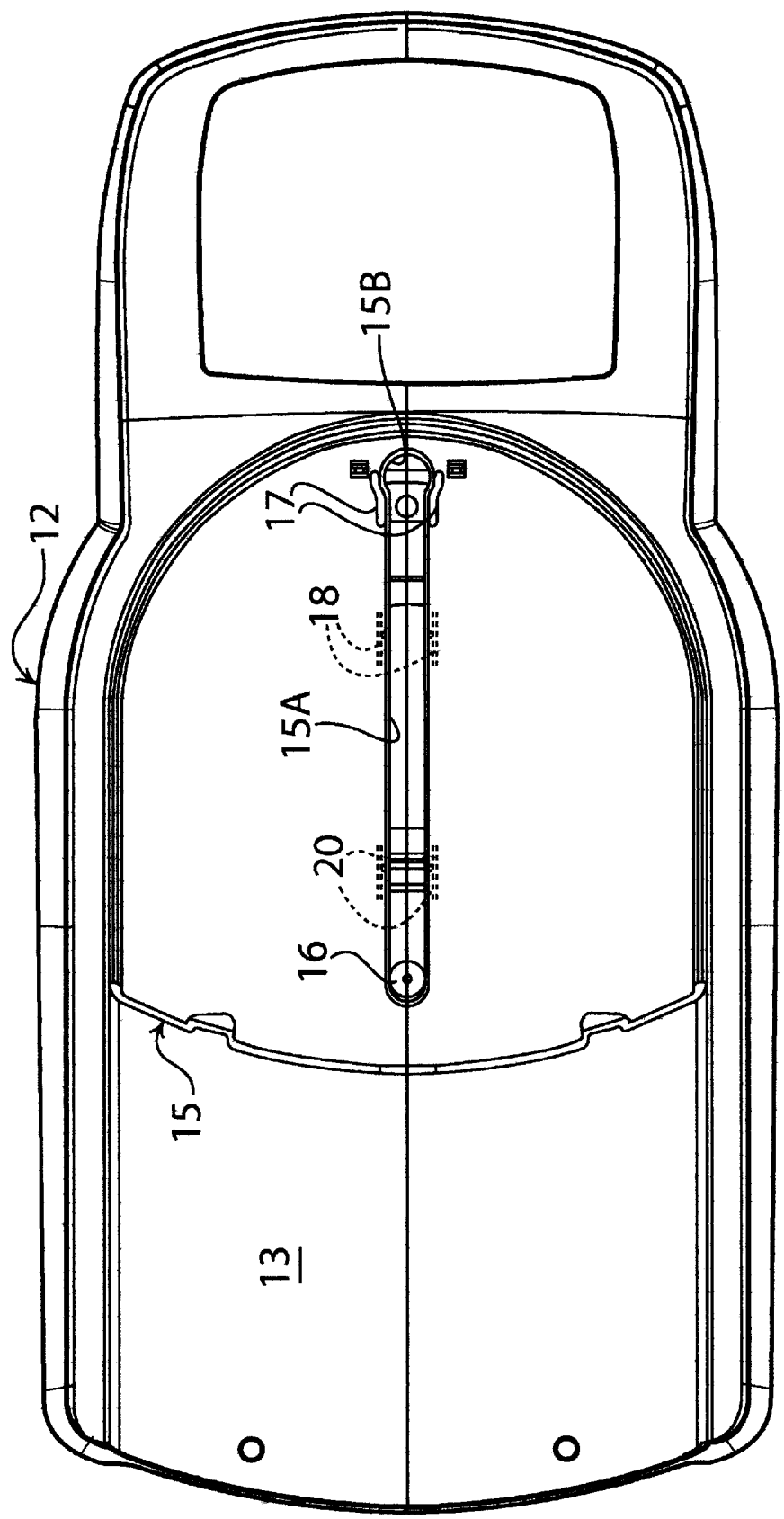
FIG. 6 is a top view of the housing illustrating the use of springs in the housing to provide retention positioning of the cover relative to the housing.

In the drawings there is shown a scientific instrument 10 comprising a housing 12 and a sliding cover 14. The cover is arcuate and is adapted to move forwardly and rearwardly in a recessed area 13 in the upper surface of the instrument housing. The vertical walls 13A along the opposite sides of the housing serve as guides to keep the cover 14 in the proper path as it is moved along between open and closed positions. The theoretical pivot point is outside and below the instrument housing's physical envelope. This is illustrated in FIG. 5.

The cover 14 is secured to a base member 15 which includes an elongated slot or raceway 15A with an enlarged opening 15B at one end. The enlarged end 15B is adapted to accept post member 16 which is secured to the upper surface of the housing in the recessed area 13. The engagement of the slot or raceway 15A on post 16 effectively holds the cover 14 and base 15 onto the upper surface of the housing. Retention springs 17 located adjacent to the enlarged end 15B of slot 15A provide retention positioning of the cover 14. Assembly and removal of the cover requires an additional force to move the cover past the spring function. The spring members provide a snap action, and the springs constrain or limit the motion of the cover within a specific distance of travel.

Opposing pairs of flexural springs 18 or 20 could also be included at various positions along the length of the slot 15A to hold the sliding cover at multiple locations along its path motion.

If desired, it is also possible to include one or more magnets in the forward end of the cover or in the housing adjacent to the forward end of the sample compartment 11. The use of a magnet in one or both of those areas would assist in keeping the cover in a tightly closed position when desired. A magnet positioned in the housing and a metal strip in the forward end of the cover (or vice-versa) would be adequate to serve this function.

Other variants are possible without departing from the scope of this invention.

What is claimed is:

1. An instrument housing having an arcuate upper surface and a sample compartment accessible from said upper surface comprising:
   (a) sliding cover means including a base with an elongated slot, said cover means being arcuate shaped;
   (b) a post member secured to said upper surface in a recess area of said instrument housing for engaging said elongated slot in said base of said cover means;
   wherein said cover means is adapted to slide on said upper surface of said instrument between open and closed positions.

2. An instrument housing in accordance with claim 1, wherein said cover means is removeable from said instrument housing.

3. An instrument housing in accordance with claim 1, wherein said upper surface of said instrument includes a recessed area in which said cover means is positioned.

4. An instrument housing in accordance with claim 1, wherein said upper surface of said housing includes said recessed area in which said cover means rests.

5. An instrument housing in accordance with claim 1, wherein said base further comprises spring members for engaging said post member.

* * * * *